(12) United States Patent
Morton et al.

(10) Patent No.: US 6,363,094 B1
(45) Date of Patent: Mar. 26, 2002

(54) GAS DISCHARGE LASER ELECTRODE WITH REDUCED SENSITIVITY TO ADVERSE BOUNDARY LAYER EFFECTS

(75) Inventors: Richard G. Morton, San Diego; Jean-Marc Hueber, La Jolla, both of CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/703,697

(22) Filed: Nov. 1, 2000

Related U.S. Application Data

(63) Continuation-in-part of application No. 09/590,961, filed on Jun. 9, 2000.

(51) Int. Cl.[7] .............................................. H01S 3/223
(52) U.S. Cl. .......................................... 372/59; 372/58
(58) Field of Search ................................ 372/55, 57–61

(56) References Cited

U.S. PATENT DOCUMENTS

| | | | |
|---|---|---|---|
| 4,414,488 A | 11/1983 | Hoffmann et al. | 315/39 |
| 4,546,482 A | 10/1985 | Bagaglia et al. | 372/86 |
| 4,686,682 A | 8/1987 | Haruta et al. | 372/87 |
| 4,703,490 A | 10/1987 | Brumme et al. | 372/86 |
| 4,774,714 A | 9/1988 | Javan | 372/109 |
| 4,876,693 A | 10/1989 | Lucero et al. | 372/82 |
| 4,959,840 A | 9/1990 | Akins et al. | 372/57 |
| 5,070,513 A | 12/1991 | Letardi | 372/83 |
| 5,535,233 A | 7/1996 | Mizoguchi et al. | 372/87 |
| 5,557,629 A | 9/1996 | Mizoguchi et al. | 372/87 |
| 5,771,258 A | 6/1998 | Morton et al. | 372/57 |
| 6,018,537 A * | 1/2000 | Hofmann et al. | 372/25 |
| 6,128,323 A * | 10/2000 | Myers et al. | 372/38 |

FOREIGN PATENT DOCUMENTS

| | | | |
|---|---|---|---|
| JP | 2631607 | 7/1997 | 3/38 |

* cited by examiner

Primary Examiner—Quyen Leung
Assistant Examiner—Davienne Monbleau
(74) Attorney, Agent, or Firm—John R. Ross, Esq.

(57) ABSTRACT

A long life laser chamber for a halogen containing gas discharge laser. In a preferred embodiment electrode erosion caused by excited fluorine (i.e., atomic fluorine and fluorine ions) is reduced by forcing the excited fluorine away from the discharge footprint of the electrodes. Preferred embodiments include electrodes with a large number of small holes in the discharge footprint through which laser gas flows to remove the excited fluorine from the footprint region in the time period between electric discharges.

19 Claims, 6 Drawing Sheets

GAS DISCHARGE LASER ELECTRODE WITH REDUCED SENSITIVITY TO ADVERSE BOUNDARY LAYER EFFECTS

This application is a continuation-in-part of Ser. No. 09/590,961, filed Jun. 9, 2000. This invention relates to electric discharge lasers and in particular to electrodes for such lasers.

BACKGROUND OF THE INVENTION

The principal components of a prior art KrF excimer laser chambers are shown in FIG. 1. This chamber is a part of a laser system used as a light source for integrated circuit lithography. These components include a chamber housing 2. The housing contains two electrodes cathode 84 and anode 83 each about 55 cm long and spaced apart by about 20 mm, a blower 4 for circulating a laser gas between the electrodes at velocities fast enough to clear (from a discharge region between the two electrodes) debris from one pulse prior to the next succeeding pulse at a pulse repetition rate in the range of 1000 Hz or greater. (Gas velocities of about 10 m/s for each 1000 Hz pulse rate is typical.) The chamber includes a water cooled finned heat exchanger 6 for removing heat added to the laser gas by the fan and by electric discharges between the electrodes. Blower 4 is typically a squirrel cage type tangential fan providing high gas flow but at relatively low differential pressure. The chamber may also include baffles 60 and 64 and vanes 66 and 68 for improving reducing discharge caused acoustic effects and the aerodynamic geometry of the chamber. The laser gas is comprised of a mixture of about 0.1 percent fluorine, about 1.0 percent krypton and the rest neon. Each pulse is produced by applying a very high voltage potential across the electrodes with a pulse power supply which causes a discharge between the electrodes lasting about 30 nanoseconds to produce a gain region about 20 mm high, 3 mm wide and 525 mm long. (Two capacitors of a peaking capacitor bank are shown at 62.) The discharge deposits about 2.5 J of energy into the gain region. As shown in FIG. 2, lasing is produced in a resonant cavity, defined by an output coupler 20 and a grating based line narrowing unit (called a line narrowing package or LNP, shown disproportionately large) 22 comprising a three prism beam expander, a tuning mirror and a grating disposed in a Littrow configuration. The energy of the output pulse 3 in this prior art KrF lithography laser is typically about 10 mJ.

FIG. 3 shows an enlarged view of cathode 84 and anode 83. Each is about 3 cm wide but the discharge region 85 is only about 3 to 4 mm wide. The direction of gas flow is shown at 86 and a gas flow of 20 m/s is indicated. The cathode and anode are typically brass. The cathode is typically slidingly mounted on an insulator 84a and the anode is typically mounted on a metal support 83A.

These KrF lithography lasers typically operate in bursts of pulses at pulse rates of about 1000 to 4000 Hz. Each burst consists of a number of pulses, for example, about 80 pulses, one burst illuminating a single die section on a wafer with the bursts separated by down times of a fraction of a second while the lithography machine shifts the illumination between die sections. There is another down time of a few seconds when a new wafer is loaded. Therefore, in production, for example, a 2000 Hz, KrF excimer laser may operate at a duty factor of about 30 percent. The operation is 24 hours per day, seven days per week, 52 weeks per year. A laser operating at 2000 Hz "around the clock" at a 30 percent duty factor will accumulate more than 1.5 billion pulses per month. Any disruption of production can be extremely expensive. For these reasons, prior art excimer lasers designed for the lithography industry are modular so that maintenance down time is minimized.

Maintaining high quality of the laser beam produced by these lasers is very important because the lithography systems in which these laser light sources are used are currently required to produce integrated circuits with features smaller than 0.25 microns and feature sizes get smaller each year. Laser beam specifications limit the variation in individual pulse energy, the variation of the integrated energy of series of pulses, the variation of the laser wavelength and the magnitude of the bandwidth of the laser beam.

Typical operation of electric discharge laser chambers such as that depicted in FIG. 1 causes electrode erosion. Erosion of these electrodes affects the shape of the discharge which in turn affects the quality of the output beam as well as the laser efficiency. Typically, anode erosion in these excimer lasers is two to three times as severe as cathode erosion.

Electrode designs have been proposed which are intended to minimize the effects of erosion by providing on the electrode a protruding part having the same width as the discharge. Some examples are described in Japanese Patent No. 2631607. These designs allow erosion to occur without substantially affecting electric fields.

What is needed is a gas discharge laser having electrodes with reduced erosion rates.

SUMMARY OF THE INVENTION

The present invention provides a long life laser chamber for a halogen containing gas discharge laser. In a preferred embodiment electrode erosion caused by excited fluorine (i.e., atomic fluorine and fluorine ions) is reduced by forcing the excited fluorine away from the discharge footprint of the electrodes. Preferred embodiments include electrodes with a large number of small holes in the discharge footprint through which laser gas flows to remove the excited fluorine from the footprint region in the time period between electric discharges.

DETAILED DESCRIPTION OF PREFERRED EMBODIMENTS

Preferred embodiments of the present invention may be described by reference to the figures.

Boundary Layer and Fall Region

Figure 1:
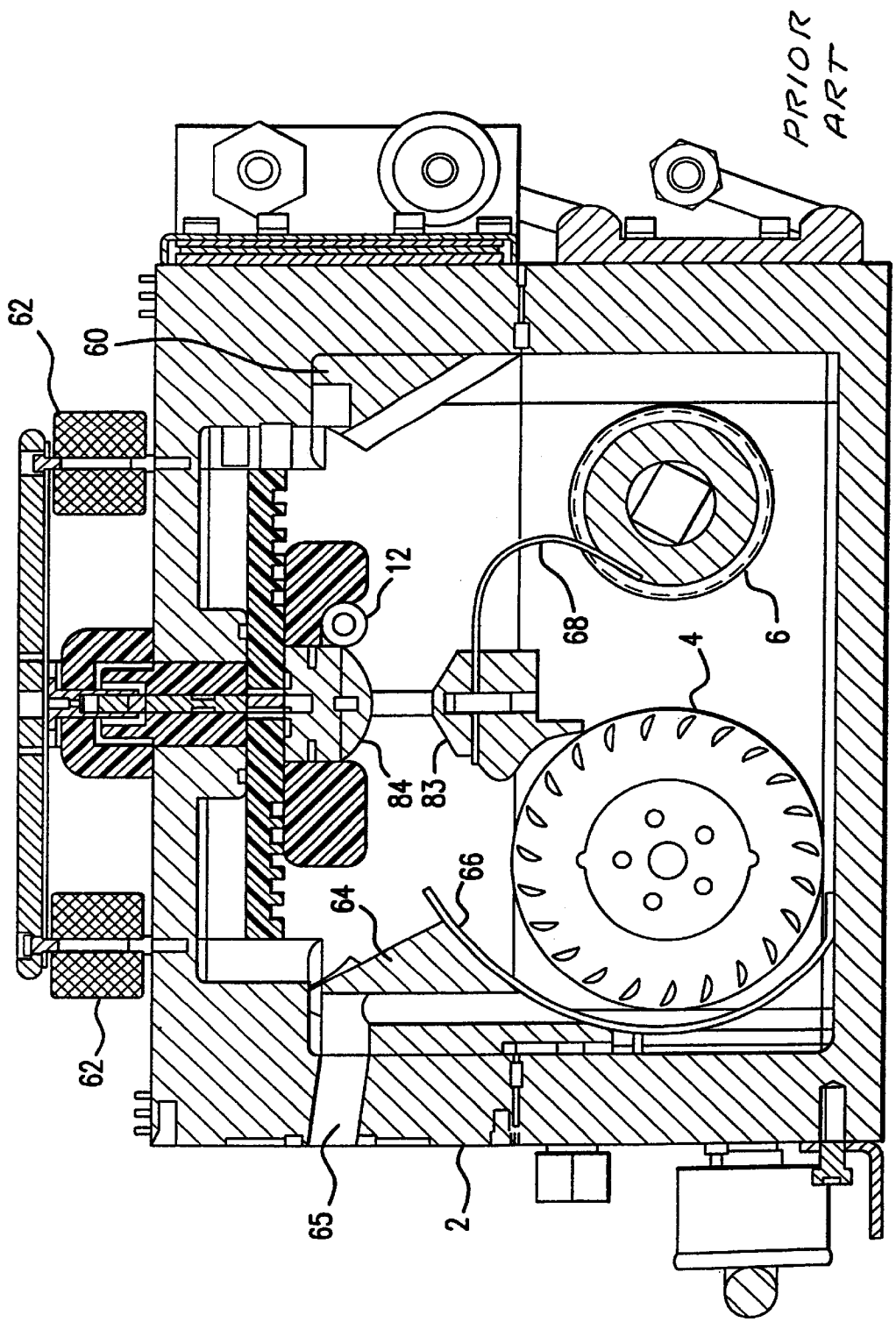
FIG. 1 shows a prior art excimer laser chamber.
Figure 2:
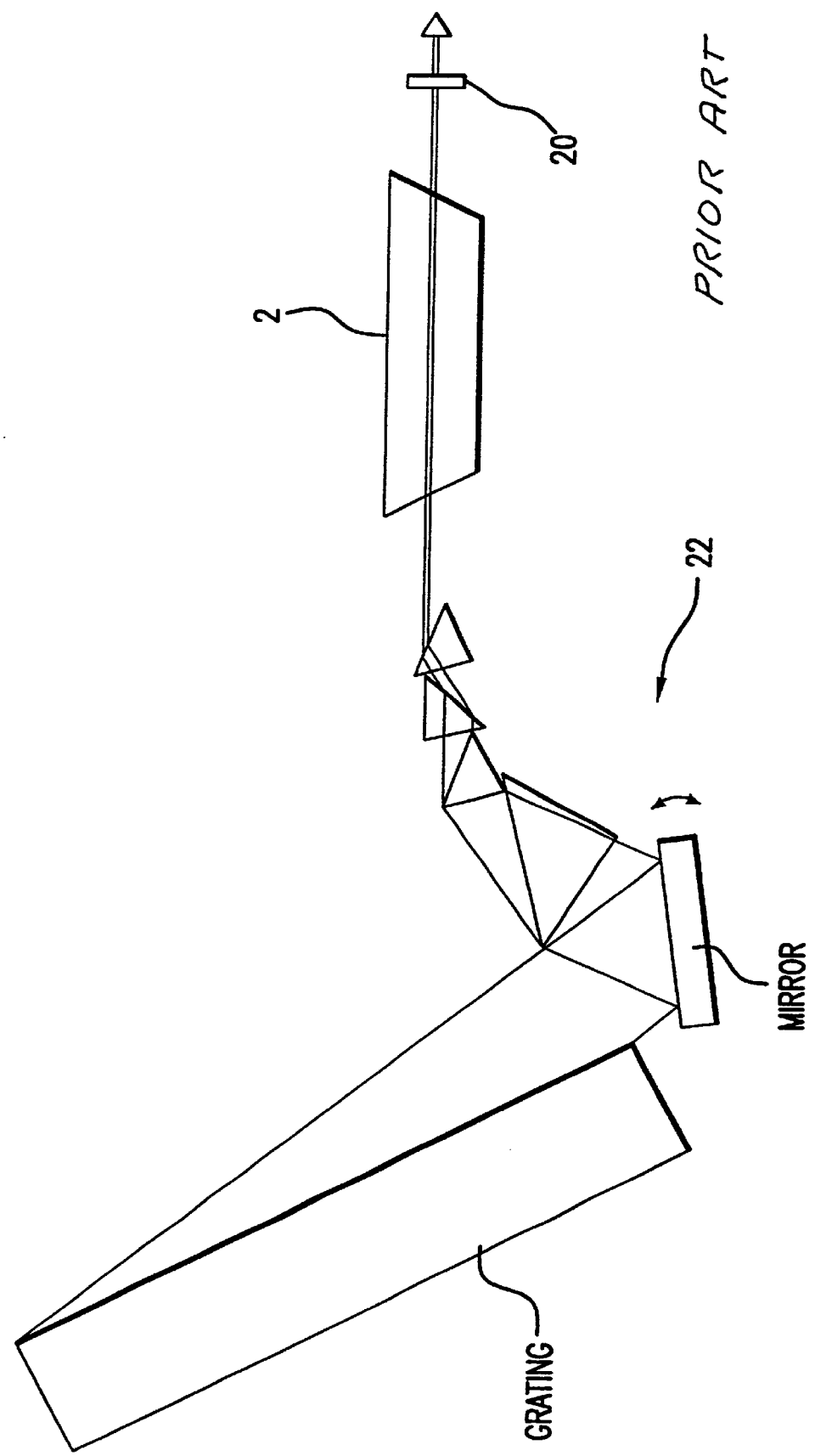
FIG. 2 shows some features of an excimer laser system.

In a typical excimer laser, such as a KrF laser, of the type shown in FIG. 1 operating (for example) at a pulse rate of 2000 pulses per second the average velocity of the gas flow between the electrodes is in the range of about 20 m/second. This means that on the average the gas moves about one centimeter between pulses (which are very short duration pulses—about 40 ns). The discharge region is about 3–4 mm wide so that the great majority of the discharged disturbed gas from one pulse is out of the discharge region prior to the start of the next pulse.

However, in a region very close to the surface of the electrodes referred to as the "boundary layer" the gas velocity is much less than the average gas velocity between the electrodes and is substantially zero at the electrode surfaces. Much of the very very small volume of discharged, disturbed gas in this volume is still present in this portion of the discharge region at the beginning of the next pulse. Following each pulse this boundary layer contains a substantial number of fluorine ions and atomic fluorine atoms. Atomic fluorine atoms are substantially more reactive than normal $F_2$ molecules and have lifetime much greater than the time between laser pulses. These atoms may combine with the atoms in the surface of the electrode to produce fluorides which during operation tend to either erode away or build up, interfering with electrode performance. Any negative fluorine ions which are still present in anode 83 boundary layer at the beginning of the next pulse will be subject to an electric field in the range 15,000 volts and will be initially accelerated rapidly for about 20 ns toward the anode 83 as shown in FIG. 1. After about 20 ns after the start of the pulse the electric polarity switches and the anode becomes charged negatively so that it will repel negative fluorine ions. However, during the first about 20 ns any negative fluorine ions located very close (i.e., less than a few mean free path lengths) to the anode will be attracted to it with vigor, thus producing a metal fluoride which will either cause erosion or degradation of the anode. Atomic fluorine also attacks the cathode and causes erosion. During the latter portion of the pulse when the cathode is charged positive with respect to the anode, the cathode will attract negative fluorine ions but since the maximum positive potential is much less (i.e., about +5,000 V), the attraction is substantially less.

Blow Away Excited Fluorine

The present invention provides electrode designs to effectively blow away a large portion of the discharge excited gas, especially excited fluorine. This includes atomic fluorine and negative fluorine ions.

First Preferred Embodiment

Figure 4:
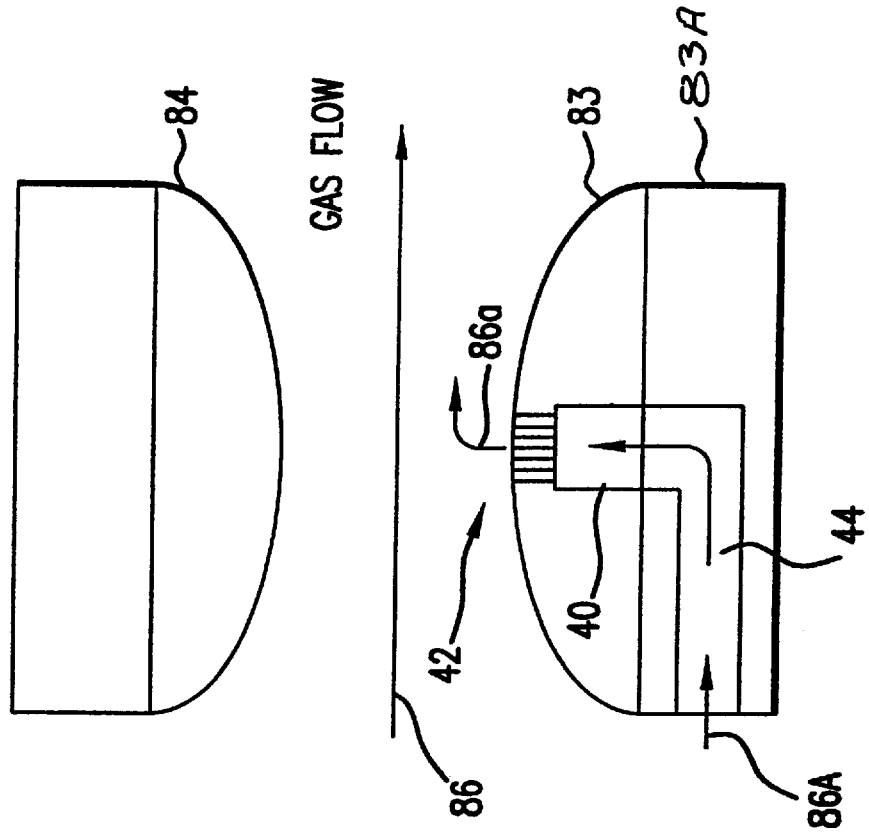
FIG. 4 shows a first preferred embodiment of the present invention.
Figure 5:
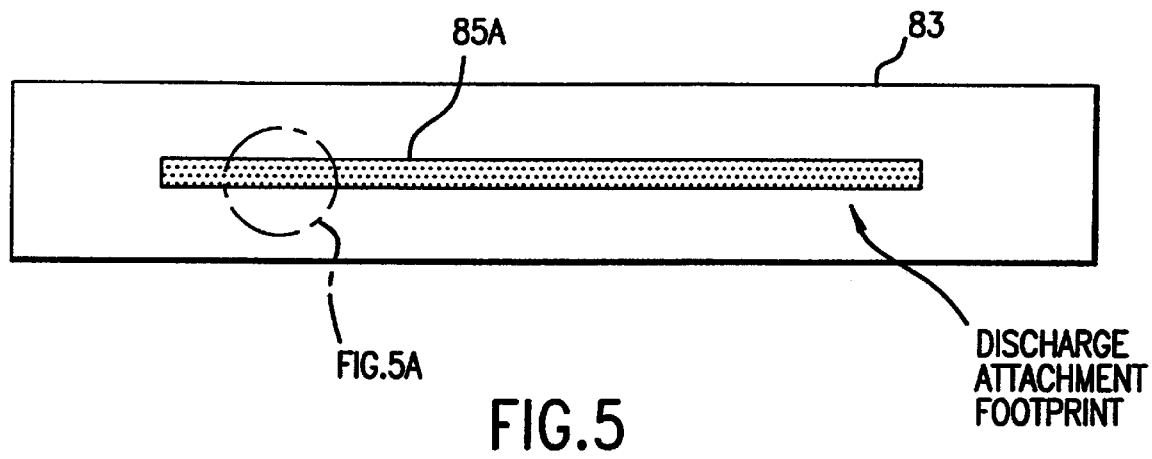
FIGS. 5 and 5A show other views of the FIG. 4 preferred embodiment.
Figure 5A:
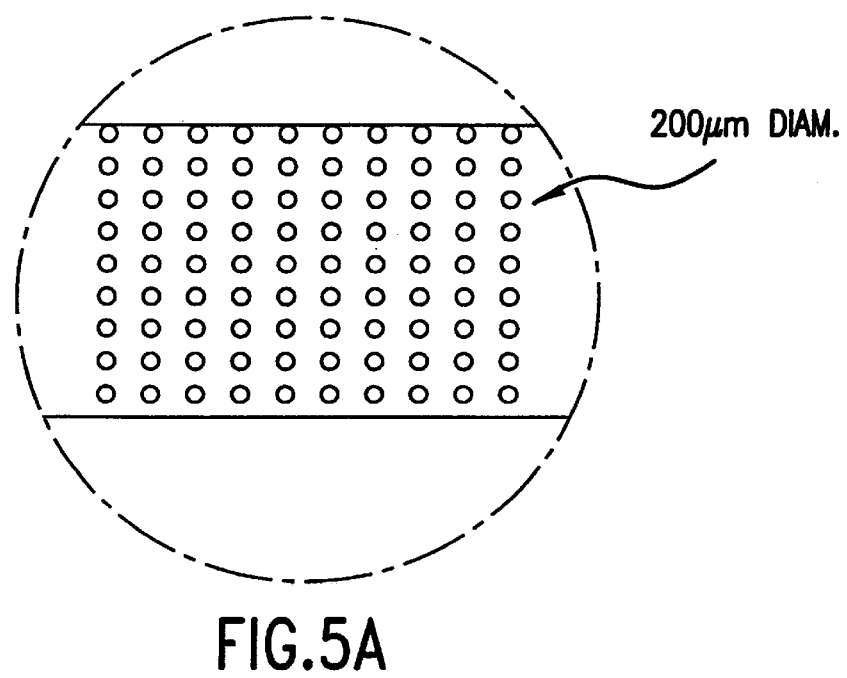

One preferred embodiment is shown in FIG. 4. In the embodiment, a longitudinal channel 40 is cut in anode 83 along its entire length and a large number of small holes 42 are drilled in the surface of the electrode to connect to the channel. In this embodiment, the holes are laser drilled and are about 0.2 mm diameter and are spaced at about 350 holes per square centimeter over the discharge region of the electrode which is about 4 mm wide for a total of about 7000 holes in the discharge footprint 85A of the anode as indicated in FIG. 5 and FIG. 5A which is a blow up of region 5A shown on FIG. 5. Channel 44 in anode support bar 83A connects channel 40 with the relatively high pressure region just downstream of fan 4. Increased gas velocity in the region between the electrodes produces a pressure drop in the region of the holes which enables enough flow the holes to replace the excited fluorine laden gas near the surface with fresh laser gas and so blow most of the discharge excited fluorine sufficiently far from the anode surface to greatly reduce fluorine-caused anode surface erosion. Gas flow through the holes 42 is indicated by arrows 86A in FIG. 4.

Second Preferred Embodiment

The FIG. 4 configuration described above provides a differential pressure promoting the flow through the small holes of the anode of only about 0.2 psi. This pressure drop is sufficient to remove a substantial portion of the excited gas from the boundary layer. If additional flow through the holes is desired a higher pressure source could be provided.

This additional pressure drop could be provided with a small auxiliary fan located outside the chamber for forcing laser gas into channel 40. (In this case, there would be no channel 44).

Another approach would be to modify the squirrel cage type tangential fan 4 shown in FIG. 1 to provide a high pressure section at one or both ends of the fan and use the high pressure gas thus produced high pressure gas in channel 40 to purge the boundary layer. The output of this fan (or these fans) could be directed along channel 40 and through holes 42.

Suction System

Figure 6:
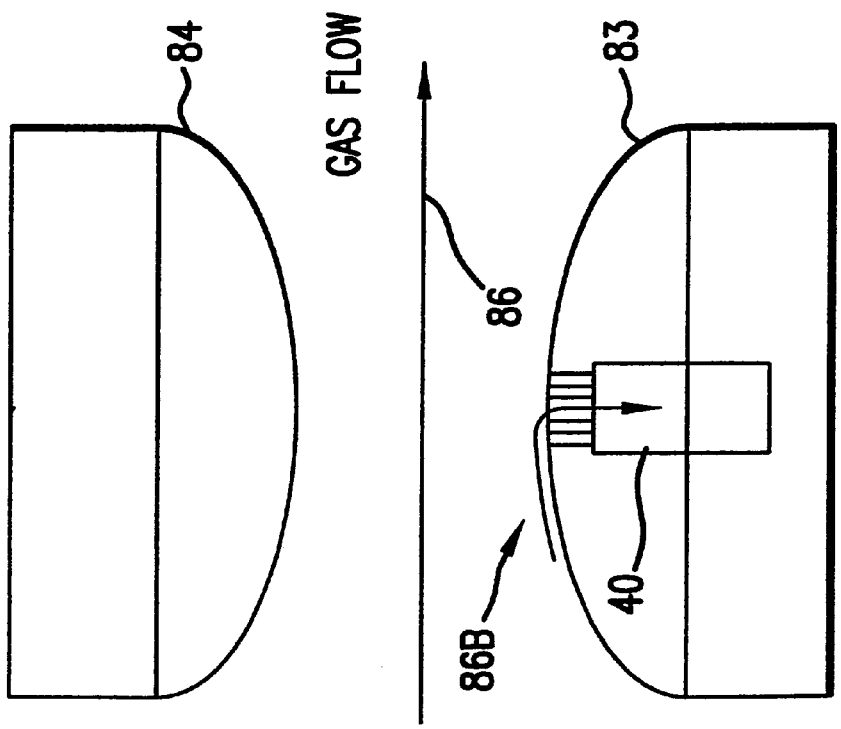
FIG. 6 shows a second preferred embodiment of the present invention.

In another preferred embodiment, a reduced pressure is provided in channel 40 to suck the gas in the boundary layer down through holes 42. In some cases sufficient pressure drop may be provided by connecting channel 40 with the low pressure side of fan 4. However, if this technique does not provide enough pressure drop to overcome the venturi effect which results in a decreased pressure in the discharge region, an additional suction source could be provided. This could be a suction source located outside the chamber or preferably it could as in the above embodiment it could be a small centrifugal type fan (or fans) driven off the shaft of fan 4. In this case, the suction port of each centrifugal fan would be connected to an end of channel 42. The gas flow direction would be as shown at 86B in FIG. 6.

Vortex Generator

Another preferred technique for breaking up the boundary layer on the electrodes is to increase the turbulence in the space immediately adjacent to the surface of the electrode. This can be done using a technique used on airplane wings to break up boundary layers on wings. Small protrusions or "trip wires" near the leading edge of the wings create vortexes which expand across the wing surface. In aircraft this technique reduces the drag coefficient. In this application, the vortexes are used to scrub otherwise stagnant excited fluorine containing gas away from the surface.

Figure 7:
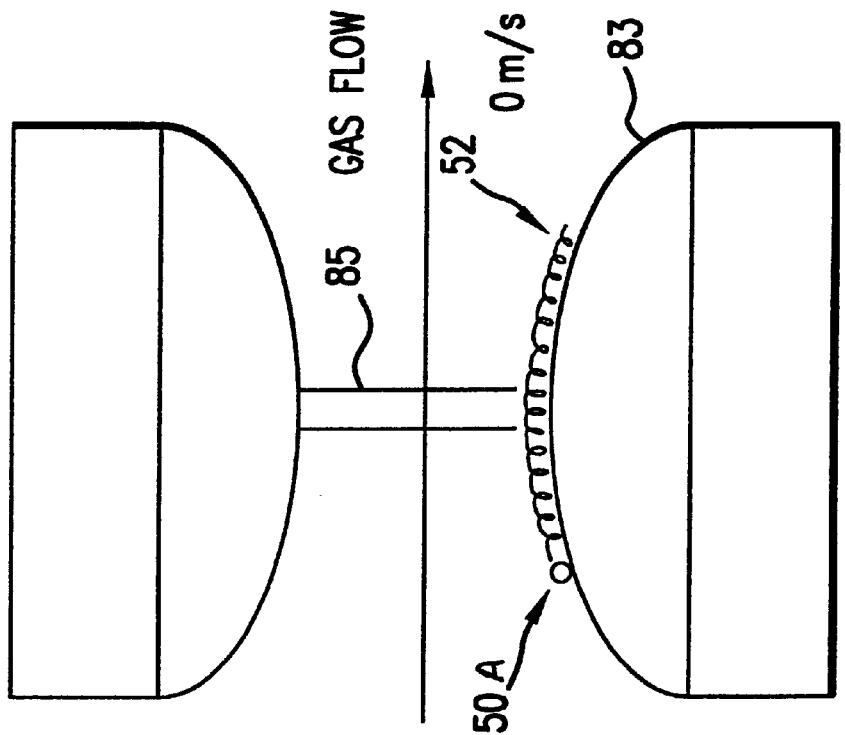
FIG. 7 shows an embodiment with a vortex generator.

In a preferred embodiment shown in FIG. 7, a brass wire 50 is positioned just far enough upstream of the discharge region 85 so as to avoid arcing from the cathode. This wire causes vortexes 52 to spread across the surface of the anode substantially breaking up the boundary layer in the discharge footprint. As an alternative to the wire, a ridge similar in size to the wire but with a rectangular shape could be machined onto the surface of the electrode at a location just far enough away from the discharge region to avoid arcing. Also, small bumps about 1 mm high could be provided. Another alternative would be to make the trip wire, the ridge or the bump out of insulator material attached to the electrode. This would permit those structures to be located closer to the discharge without affecting it.

Bias Wire

In another preferred embodiment trip wire 50 is located off the surface of anode 83 and a positive bias is applied to it with respect to anode 83 which is at ground potential. This configuration then serves a dual purpose. The wire first serves as a trip wire to create the vortexes as shown in FIG. 7 and it also creates an electric field during the intervals between pulses which accelerates negative ions (especially fluorine ions) away from the anode so that at the start of each pulse many fewer fluorine ions are close enough to the anode to be captured by it at the beginning of the pulse when the voltage potential rises to about +15,000 volts. The potential bias circuit should be chosen to create an effective field but to avoid arcing and should include sufficient inductance to keep current flow to a minimum.

Raised Erosion Surface

Figure 3:
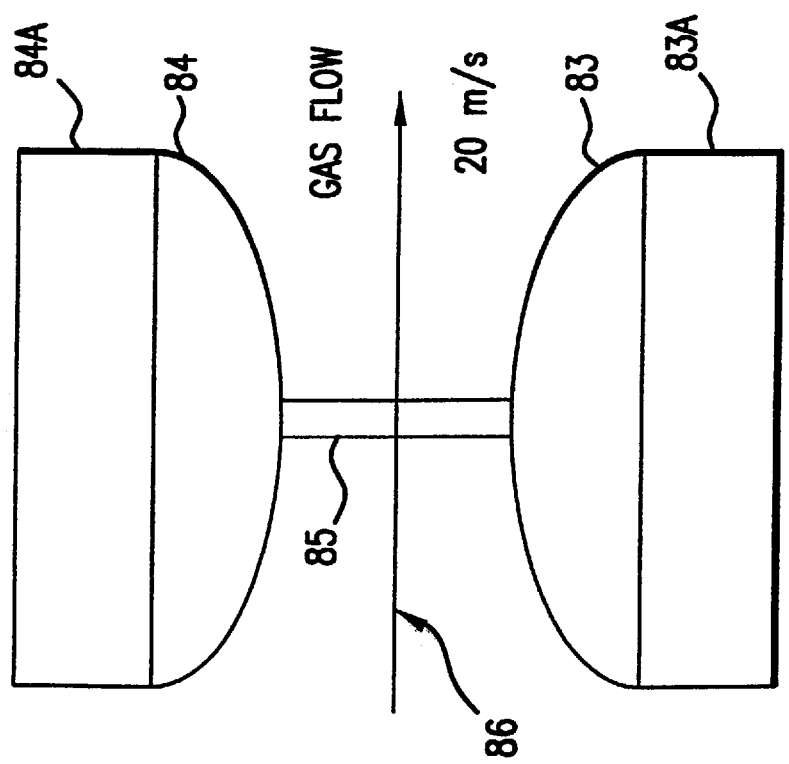
FIG. 3 is a sketch showing a prior art set of electrodes.
Figure 8:
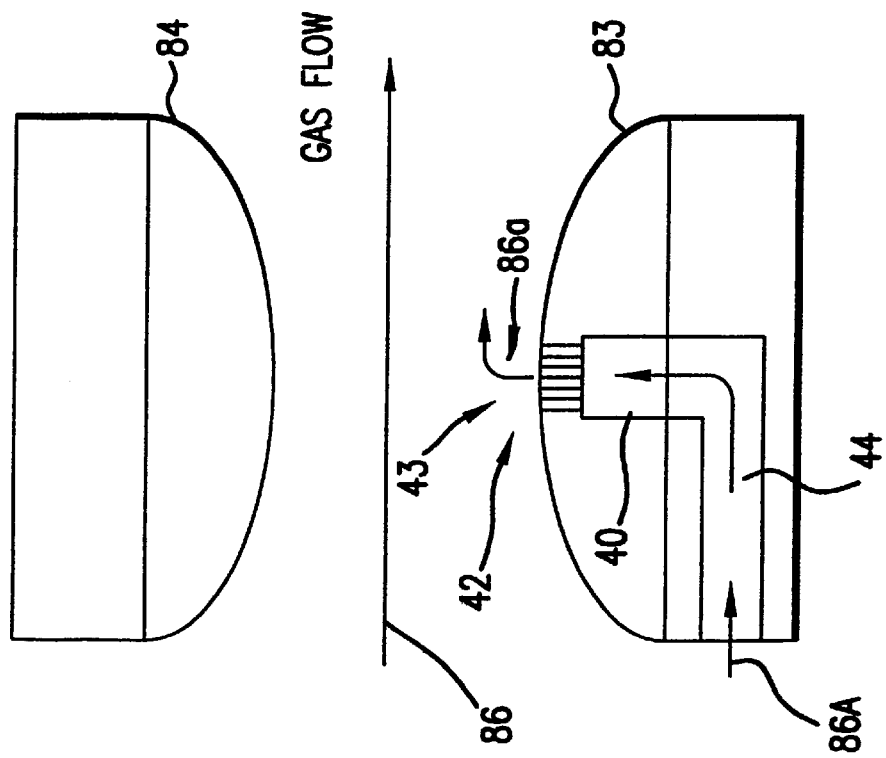
FIG. 8 shows an electrode with a raised discharge footprint.

With respect to each of the techniques described above to blow away atomic fluorine and fluorine ions, electrode life can be further improved by slightly raising the electrode surface at the footprint of the discharge as shown at 43 in FIG. 8. In this case, a 4 mm wide region approximating the discharge footprint is raised 0.3 mm. This raised region will very slowly erode during the electrode lifetime and will be substantially gone at about the midpoint of electrode life. At the end of the electrode life, there will be a slight cavity along the discharge footprint as is the case with prior art electrodes having the original shape shown in FIG. 3.

Electrode Vanes

Figure 9:
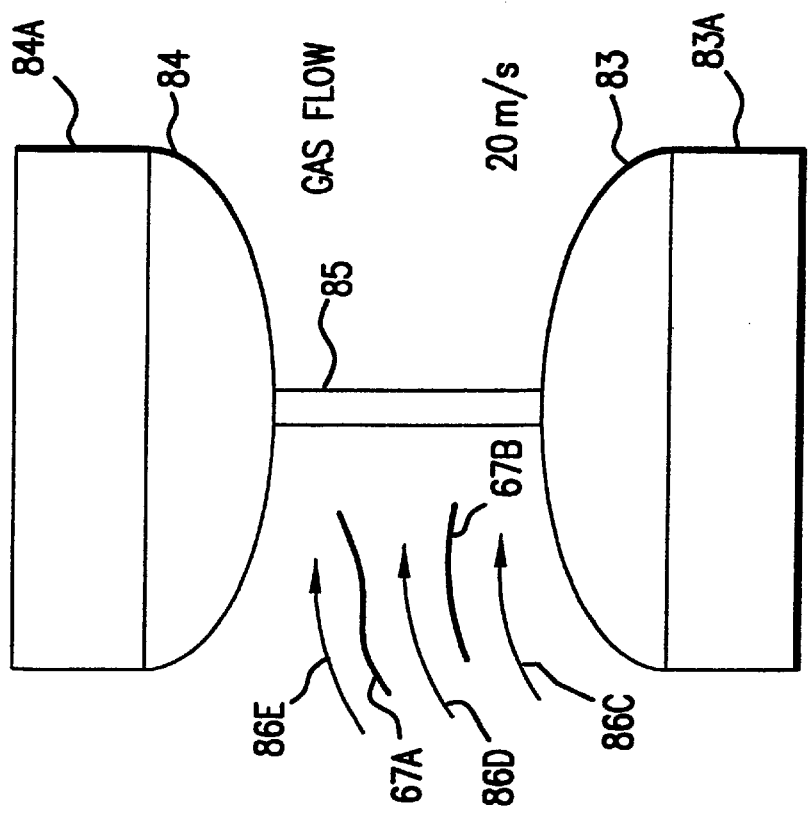
FIG. 9 shows an embodiment with vanes for increasing gas flow near the discharge footprint.

Another technique for helping to blow away atomic fluorine and fluorine ions is shown in FIG. 9. Here vanes 67A and 67B are positioned upstream of the discharge region to direct flow through the region preferentially, as shown by arrows 86C, 86D and 86E, toward the surfaces of cathode 84 and anode 83.

While the invention has been described above with specificity in terms of preferred embodiments, the reader should understand and recognize that many changes and alterations could be made without deviating from the spirit of the invention. The principals of this invention could be applied to many other gas discharge lasers other than KrF lasers such as, for example, ArF lasers, $F_2$ laser. The footprint region could be raised by amounts different than the 0.3 mm referred to above. Raised surfaces of between about 0.2 to 2 mm are preferred. Although the techniques described in the drawings all are shown applied to the anode where erosion is typically greater, these techniques could also be applied to the cathode to reduce cathode erosion due to fluorine attack. Therefore, the scope of the invention should be determined by the appended claims and their legal equivalents.

I claim:

1. A laser chamber for a gas discharge laser comprising:
   A. a laser gas comprising fluorine,
   B. at least two elongated electrodes defining a discharge region and a discharge footprint on each of said electrodes,
   C. a fan for circulating said laser gas through said discharge region,
   D. a boundary layer excited fluorine reduction means for reducing the residence time of atomic fluorine and fluorine ions within a thin gas layer adjacent to the discharge footprint of at least one of said electrodes.

2. A laser chamber as in claim 1 wherein said boundary layer excited fluorine reduction means comprises a plurality of small holes in the discharge footprint of said at least one of said electrodes.

3. A laser chamber as in claim 2 wherein said at least one electrode comprises a first channel in flow communication with said plurality of small holes.

4. A laser chamber as in claim 3 and further comprising a second channel providing flow communication to a high pressure laser gas region of said chamber so as to permit laser gas flow from said high pressure region through said plurality of holes through said discharge footprint.

5. A laser chamber as in claim 3 and further comprising a second channel providing flow communication to a low pressure laser gas region of said chamber so as to permit laser gas flow from a region above said discharge footprint through said plurality of small holes to said low pressure region.

6. A laser chamber as in claim 4 wherein said high pressure region is immediately downstream of said fan.

7. A laser chamber as in claim 6 wherein said low pressure region is immediately upstream of said fan.

8. A laser chamber as in claim 4 wherein said fan defines a first fan and said high pressure region is provided by at least one additional fan.

9. A laser chamber as in claim 8 wherein said at least one additional fan is driven from a shaft of said first fan.

10. A laser chamber as in claim 4 wherein said fan defines a first fan and said low pressure region is provided by at least one additional fan.

11. A laser chamber as in claim 10 wherein said at least one additional fan is driven from a shaft of said first fan.

12. A laser chamber as in claim 1 wherein said boundary layer excited fluorine reduction means comprises a vortex generator for generating vortexes within a thin gas layer adjacent to the discharge footprint of at least one of said electrodes.

13. A laser chamber as in claim 12 wherein said vortex generator is a trip wire.

14. A laser chamber as in claim 12 wherein said vortex generator is a ridge machined on said at least one of said electrodes.

15. A laser chamber as in claim 12 wherein said vortex generator is comprised of a plurality of small bumps on a surface of said at least one of said electrodes.

16. A laser chamber as in claim 12 wherein said vortex generator is biased positive with respect to said at least one of said electrodes.

17. A laser chamber as in claim 1 wherein said at least one of said electrodes comprises a raised region located at said discharge footprint.

18. A laser chamber as in claim 17 wherein said raised region is raised about a distance of less than 2 mm and greater than 0.2 mm.

19. A laser chamber for a gas discharge laser comprising:
   A. a laser gas comprising a halogen,
   B. at least two elongated electrodes defining a discharge region and a discharge footprint on each of said electrodes,
   C. a fan for circulating said laser gas through said discharge region,
   D. a boundary layer excited halogen reduction means for reducing the residence time of atomic halogen and halogen ions within a thin gas layer adjacent to the discharge footprint of at least one of said electrodes.

* * * * *